United States Patent
Wang

(10) Patent No.: US 9,490,835 B2
(45) Date of Patent: Nov. 8, 2016

(54) MODULATION CIRCUIT AND MODULATION METHOD WITH DIGITAL ELD COMPENSATION

(71) Applicant: MediaTek Inc., Hsin-Chu (TW)

(72) Inventor: Tze-Chien Wang, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/603,590

(22) Filed: Jan. 23, 2015

(65) Prior Publication Data

US 2015/0358029 A1    Dec. 10, 2015

Related U.S. Application Data

(60) Provisional application No. 62/009,979, filed on Jun. 10, 2014.

(51) Int. Cl.
*H03M 3/00* (2006.01)

(52) U.S. Cl.
CPC ............... *H03M 3/37* (2013.01); *H03M 3/458* (2013.01)

(58) Field of Classification Search
CPC ...... H03M 3/454; H03M 3/37; H03M 3/506; H03M 3/452; H03M 3/456; H03M 5/08; H03M 7/3017; H03M 7/3026; H03M 7/304; H03M 1/00; H03M 1/0668; H03M 1/66; H03M 3/30; H03M 3/406; H03M 3/38; H03M 7/03
USPC ......................... 341/143, 141, 155, 118, 120
See application file for complete search history.

(56) References Cited

U.S. PATENT DOCUMENTS

| | | | | |
|---|---|---|---|---|
| 5,548,286 A * | 8/1996 | Craven | ............... | H03M 1/1038 332/107 |
| 6,313,774 B1 * | 11/2001 | Zarubinsky | ........... | H03M 3/412 341/143 |
| 7,450,047 B1 * | 11/2008 | Wu | ........ | H03M 3/412 341/143 |
| 7,522,079 B1 * | 4/2009 | Wu | ........ | H03M 3/412 341/118 |
| 7,592,942 B2 * | 9/2009 | Komatsu | ............. | H03M 1/0624 341/141 |
| 8,018,379 B1 * | 9/2011 | Sun | ......... | G01S 19/33 342/357.73 |
| 2005/0068213 A1 * | 3/2005 | Fontaine | ................. | H03M 3/37 341/143 |
| 2005/0285766 A1 * | 12/2005 | San | ......... | H03M 3/34 341/143 |
| 2007/0236374 A1 * | 10/2007 | Brueske | .............. | G01S 7/52028 341/143 |
| 2008/0297386 A1 * | 12/2008 | Maloberti | ............. | H03M 3/428 341/143 |
| 2011/0037629 A1 * | 2/2011 | Ceballos | ............... | H03M 3/412 341/120 |
| 2011/0200077 A1 * | 8/2011 | Mitani | .................. | H03M 3/388 375/219 |

(Continued)

OTHER PUBLICATIONS

Fontaine, et al.: "A Low-Noise Low-Voltage CT ΔΣ Modulator with Digital Compensation of Excess Loop Delay"; ISSCC 2005 / Session 27 / Filters and Continous-Time ΔΣ Converters / 27.4; pp. 498, 499, and 613. van Veldhoven, et al.: "An Inverter-Based Hybrid ΣΔ Modulator"; ISSCC 2008 / Session 27 / ΔΣ Data Converters / 27.3; pp. 492, 493, and 630.

(Continued)

*Primary Examiner* — Linh Nguyen
(74) *Attorney, Agent, or Firm* — McClure, Qualey & Rodack, LLP

(57) ABSTRACT

A modulation circuit includes a digital quantizer and a compensation circuit. The digital quantizer is utilized to receive and truncate a digital quantizing input signal for generating a digital quantizing output signal. The compensation circuit compensates for a time delay of the modulation circuit and generates a compensation output signal. The digital quantizing input signal is generated by subtracting the compensation output signal from a digital integration output signal to compensate for the time delay before truncating the digital quantizing input signal.

18 Claims, 6 Drawing Sheets

(56) References Cited

U.S. PATENT DOCUMENTS

2012/0112943 A1* 5/2012 Lin .................. H03M 3/30
                                              341/143
2013/0021182 A1* 1/2013 Mishra ............. H03M 3/496
                                              341/143

OTHER PUBLICATIONS

Sukumaran, et al.: "A 280µW Audio Continuous-time ΔΣ Modulator with 103 dB DR and 102 dB A-Weighted SNR"; 978-1-4799-0280-4/13/$31.00 copyright 2013 IEEE; pp. 385-388.

* cited by examiner

MODULATION CIRCUIT AND MODULATION METHOD WITH DIGITAL ELD COMPENSATION

CROSS REFERENCE TO RELATED APPLICATIONS

This application claims the benefit of U.S. Provisional Application No. 62/009,979, filed on Jun. 10, 2014, the entirety of which is incorporated by reference herein.

BACKGROUND OF THE INVENTION

1. Field of the Invention

The present inventive concept relates to modulation circuits and modulation methods. More particularly, the inventive concept relates to modulation circuits and modulation methods with digital excess loop delay (ELD) compensation for delta-sigma modulators (DSM).

2. Description of the Related Art

Generally, DSMs are widely utilized in audio applications. As semiconductor manufacturing technology develops, digital circuits increasingly have the advantages of smaller sizes and lower power consumption. However, the size of analog circuits is still limited by stringent design considerations such as flicker noise, device matching, and additional layout rules. Furthermore, within the DSM, the later stages (such as the second stage and the third stage) and the quantizer occupy a large circuit area.

Accordingly, it is desired to replace analog circuits with equivalent digital circuits whenever possible to reduce the circuit area. However, when the later stages are implemented by digital circuits, it would need to feedback immediately without delay. A big flash quantizer would also be required. In addition, when the ELD compensation is utilized, it would be limited and cannot be utilized to compensate for the signal delay with any bits of code or any value of gain.

Therefore, there is a need in the art to address at least some of the issues associated with reduced circuit area, feedback latency, or ELD compensation.

BRIEF SUMMARY OF THE INVENTION

The present invention provides a modulation circuit including a digital quantizer and a compensation circuit. The digital quantizer is utilized to receive and truncate a digital quantizing input signal for generating a digital quantizing output signal. The compensation circuit couples to the digital quantizer. The compensation circuit is utilized to compensate for a time delay of the modulation circuit and generate a compensation output signal. The digital quantizing input signal is generated by subtracting the compensation output signal from a digital integration output signal to compensate for the time delay before truncating the digital quantizing input signal.

The present invention provides a modulation circuit including an analog quantizer and a processing circuit. The analog quantizer receives a first input signal for generating a first digital input signal and receives a second input signal for generating a second digital input signal. The first input signal and the second input signal are generated in different channels. In addition, the processing circuit is coupled to the analog quantizer for compensating a time delay of the modulation circuit. The processing circuit truncates the first digital input signal to generate a first truncation signal after the time delay is compensated for, and truncates the second digital input signal to generate a second truncation signal after the time delay is compensated for.

The present invention provides modulation method utilized for a modulation circuit. The modulation method comprises compensating a time delay of the modulation circuit by receiving an output signal and generating a compensation output signal; generating a digital quantizing input signal by subtracting the compensation output signal from a digital integration output signal; truncating and quantizing the digital quantizing input signal to generate a digital quantizing output signal, and compensating the time delay is executed before truncating and quantizing the digital quantizing input signal; and adding a truncation noise to the digital quantizing output signal to generate the output signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
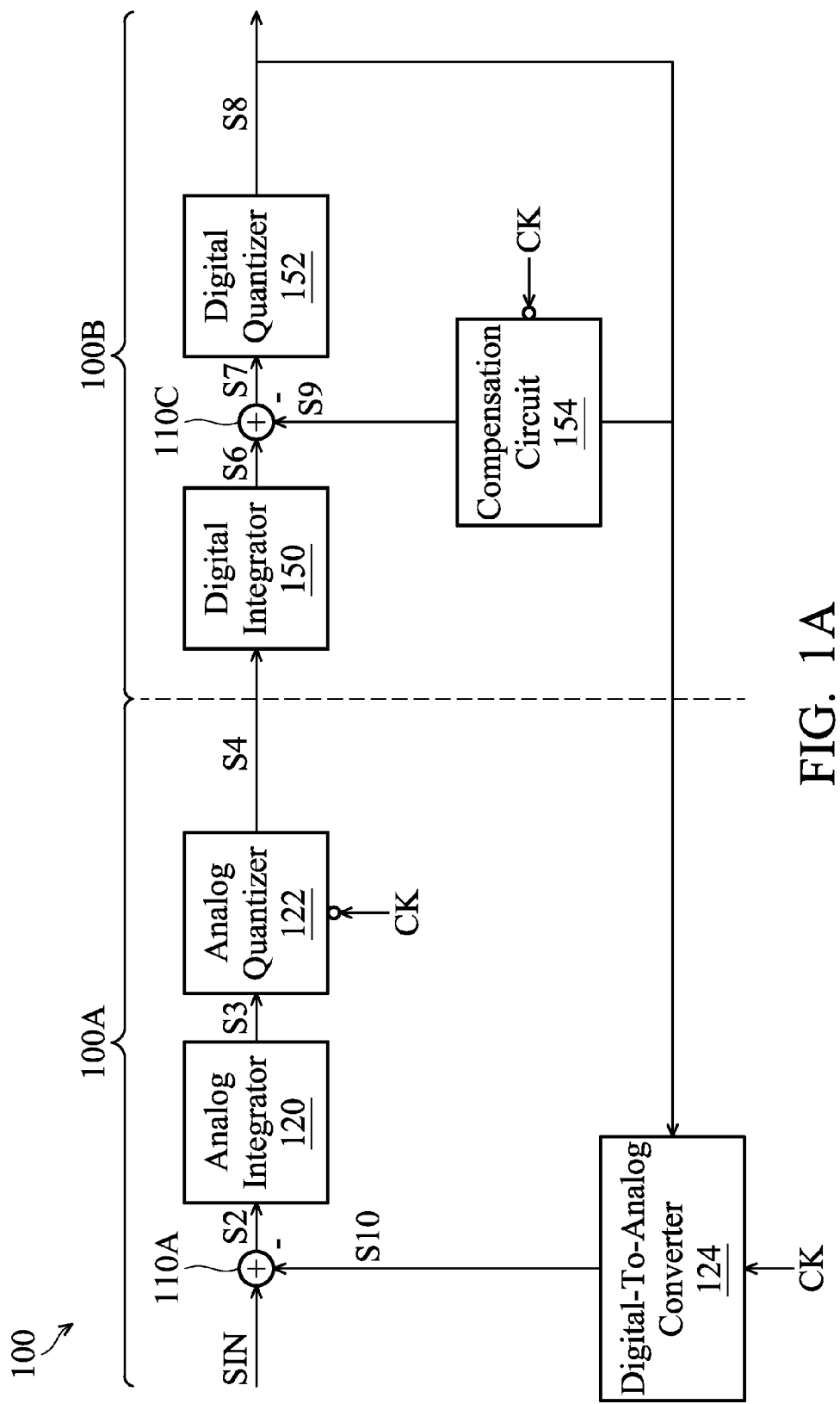
FIG. 1A is a schematic diagram of a modulation circuit according to the present invention.

FIG. 1A is a schematic diagram of a modulation circuit 100 according to the present invention. For example, the modulation circuit 100 is a delta-sigma modulator (DSM) used in audio applications. In one embodiment, the modulation circuit 100 includes an analog stage 100A and a digital stage 100B. The analog stage 100A includes an adder 110A, an analog integrator 120, an analog quantizer 122 and a digital-to-analog converter 124. In addition, the digital stage 100B includes an adder 100C, a digital integrator 150, a digital quantizer 152 and a compensation circuit 154. Specifically, the adder 110A (the third adder) is utilized to subtract a signal S10 (the analog output signal) from a signal SIN (the input signal) for generating a signal S2 (the analog input signal). It should be noted that only one channel of the modulation circuit 100 is illustrated in FIG. 1A. As such, the signal SIN could be an audio signal of the left channel or the right channel.

In one embodiment, the analog integrator 120 is arranged on the analog stage 100A and connected to the adder 110A to receive and integrate the signal S2 for generating the signal S3 (the analog quantizing input signal). Afterwards, the analog quantizer 122 is arranged on the analog stage 100A, connected to the analog integrator 120 and triggered by a clock signal CK for sampling, converting and quantizing the signal S3 (the analog quantizing input signal) into a signal S4 (the digital conversion signal). The analog quantizer 122 digitizes or quantizes the signal S3 at the falling edge of the clock signal CK. For example, the analog quantizer 122 is an analog-to-digital converter. More specifically, the analog quantizer 122 is a 6-bit asynchronous successive approximation register (ASAR) analog-to-digital converter.

It should be noted that the quantization noise SN1 exists when the signal S3 is converted into signal S4 by the analog quanitizer 122, and the quanitization noise SN1 is suppressed by the analog integrator 120. In addition, the modulation circuit 100 also includes the digital integrator 150 arranged on the digital stage 100B to receive and integrate the signal S4 for generating the signal S6 (the digital integration output signal). For example, the digital integrator 150 is a digital low-pass filter. In addition, the adder 110C (the first adder) is arranged on the digital stage 100B and connected between the digital integrator 150 and the digital quantizer 152. The adder 110C is utilized to subtract a signal S9 (the compensation output signal) from the signal S6 for outputting the signal S7 (the digital quantizing input signal) to the digital quantizer 152. The signal S9 is outputted by the compensation circuit 154.

In one embodiment, the digital quantizer 152 is arranged on the digital stage 100B and utilized to receive and truncate the signal S7 for generating the signal S8 (the digital quantizing output signal). As shown in FIG. 1A, in addition, the compensation circuit 154 is arranged on the digital stage 100B, triggered by the clock signal CK and connected to the adder 110C and the digital quantizer 152. For example, the compensation circuit 154 can be realized by a D-type flip flop (DFF) and a digital multiplier. The compensation circuit 154 is utilized to compensate for a time delay of the modulation circuit 100 and generate the signal S9 based on the signal S8. More specifically, it takes time for the analog quantizer 122 to sample and quantize the signal S3, and is also takes time to feed the signal S8 back to the analog stage 100A. Accordingly, there would be a time delay in the modulation circuit 100, as such, a digital ELD compensation executed by the compensation circuit 154 is provided to compensate for the time delay. It should be noted that the signal S7 is generated by subtracting the signal S9 from the signal S6 with the adder 110C which is connected between the digital quantizer 152 and the compensation circuit 154, therefore, the time delay is compensated for before truncating the signal S7. For example, the digital integrator 150 filters or integrates the 6-bit code from the analog quantizer 122, and the 3-bit code is truncated and outputted by the digital quantizer 152 with the ELD compensation executed by the compensation circuit 154.

It should be noted that the truncation noise SN2 exists when the digital quanitizer 152 truncates the signal to obtain the signal S8, and the truncation noise SN2 is suppressed by the analog integrator 120, the digital integrator 150 and/or the digital quantizer 152. In addition, the digital-to-analog converter 124 is arranged on the analog stage 100A and connected between the adder 110A and the digital quanitizer 152. The digital-to-analog converter 124 is triggered by the clock signal CK to convert the signal S8 and generate the signal S10 (the analog output signal). Specifically, the digital-to-analog converter 124 operates or converts the signal S8 at the rising edge of the clock signal CK. In this embodiment, the signal S9 is generated by the compensation circuit 154 according to the signal S8, and the signal S9 is utilized to compensate the time delay of the modulation circuit 100.

Since the digital quantizer 152 and the compensation circuit 154 are both arranged on the digital stage 100B and the signal of the modulation circuit 100 is compensated for before being truncated by the digital quantizer 152, the modulation circuit 100 has the advantage of compensating for the signal delay with any bits of code or any value of gain. Compared with the compensation of limited gain, the compensation with any bits of code or any value of gain of the present invention provides a better compensating effect and a more stable circuit performance. In addition, another advantage of the modulation circuit 100 is that it does not need to feed back immediately. For example, in one embodiment, a delay of half of the clock period is allowed for the analog quantizer 122 and the digital stage 100B. The reason is that the time delay is lumped after the analog quantizer 122. Furthermore, an arbitrary and direct feedback gain can be derived accordingly for the ELD compensation by the compensation circuit 154. The feedback path is on the digital stage 100B, and it only takes effect in the next sample to justify the derivation. Therefore, the feedback latency is allowed in the modulation circuit 100 of the present invention.

Figure 1B:
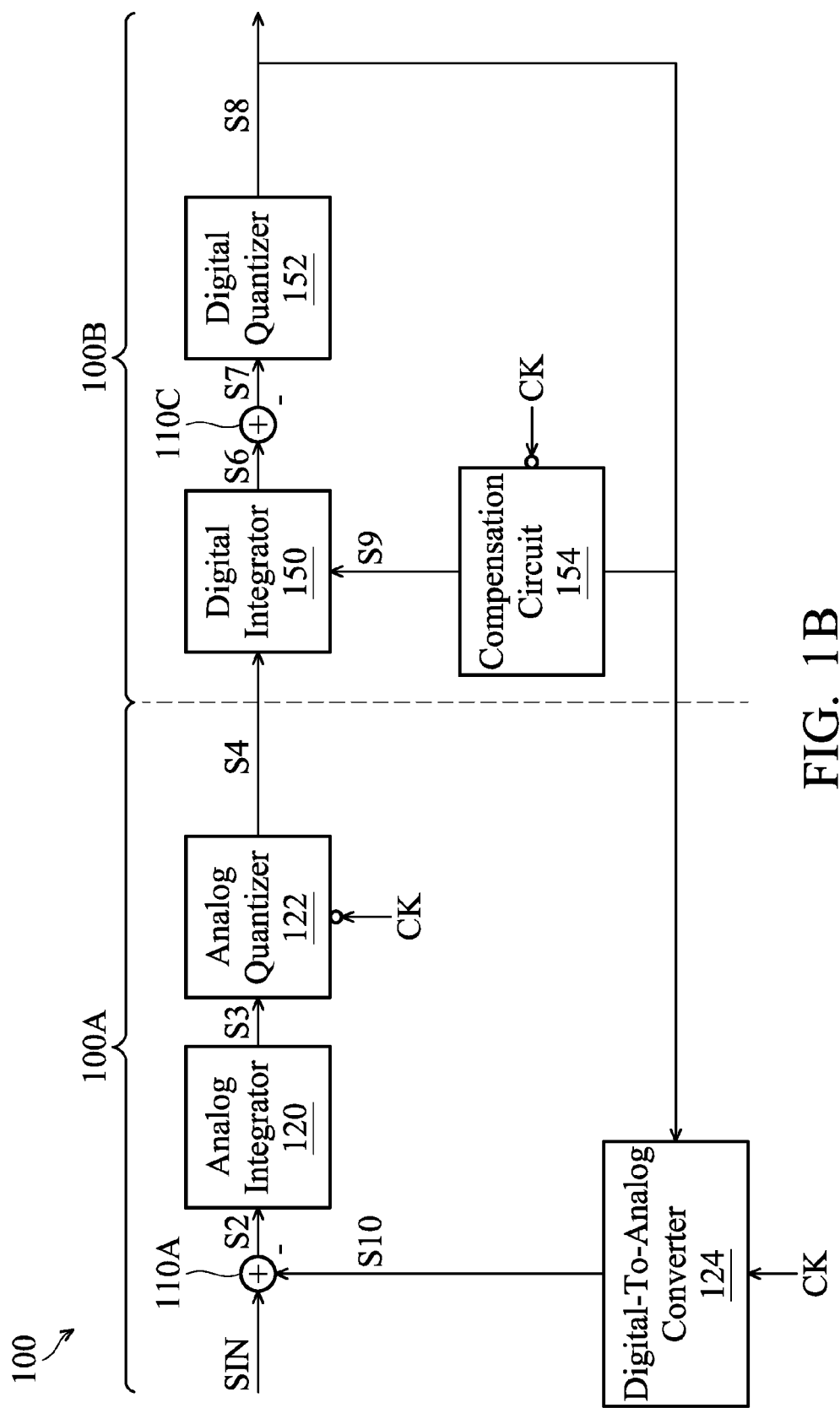
FIG. 1B is another schematic diagram of a modulation circuit according to the present invention.
Figure 1C:
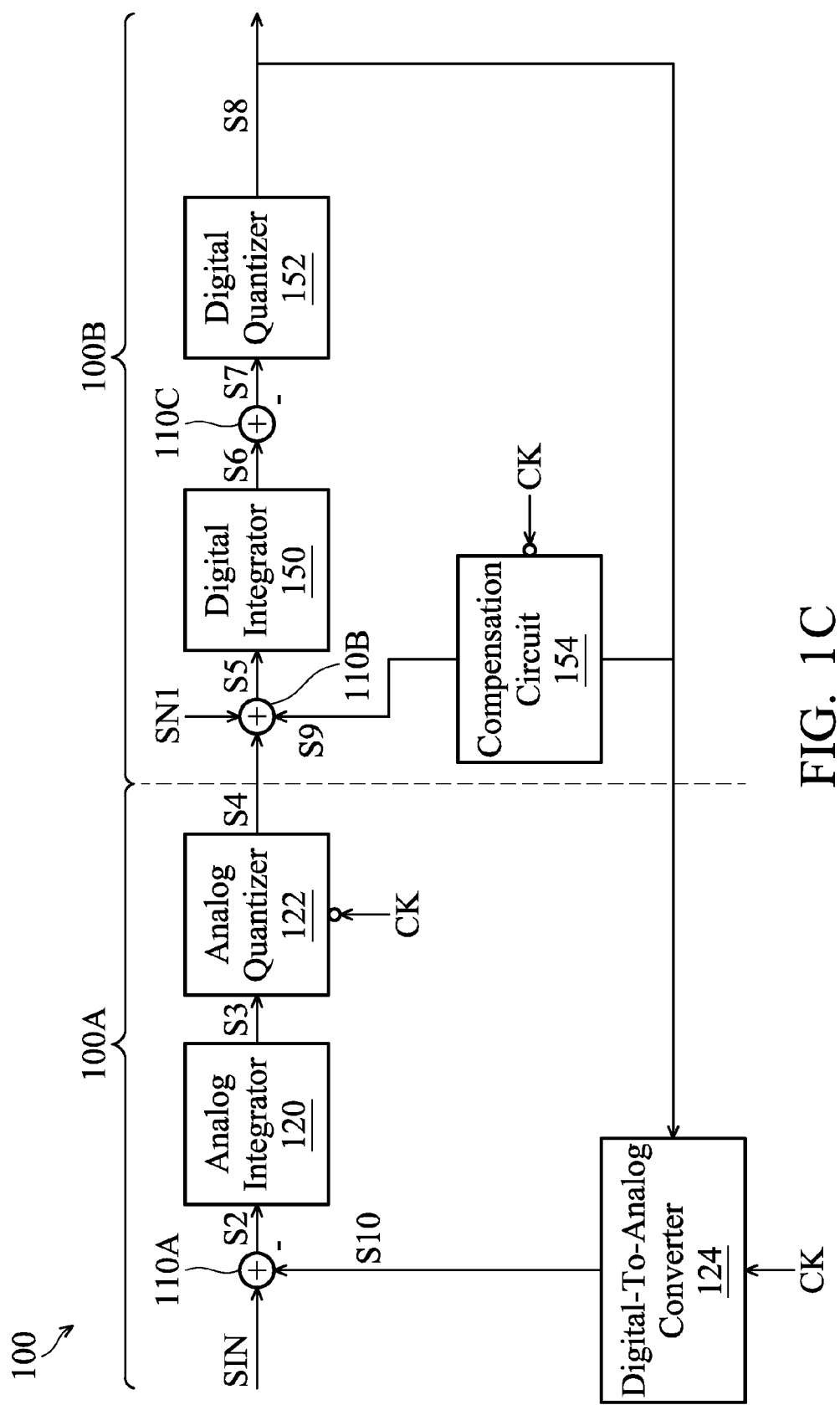
FIG. 1C is another schematic diagram of a modulation circuit according to the present invention.

FIG. 1B is another schematic diagram illustrating the modulation circuit 100 according to the present invention. The difference between the embodiments of FIG. 1A and FIG. 1B is that, as shown in FIG. 1B, the signal S9 of the compensation circuit 154 is transmitted to the digital integrator 150. Accordingly, the signal S9 of the compensation circuit 154 is compensated for on the digital stage 100B before being truncated by the digital quantizer 152 in order to provide a better compensation with unlimited gains. FIG. 1C is another schematic diagram illustrating the modulation circuit 100 according to the present invention. Compared to FIG. 1A and FIG. 1B, the signal S9 of the compensation circuit 154 shown in FIG. 1C is transmitted to the adder 110B. Therefore, the signal S9 of the compensation circuit 154 is compensated for on the digital stage 100B before being truncated by the digital quantizer 152 to provide a better compensation with unlimited gains.

Furthermore, on the one hand, by adopting the analog stage 100A as the first stage, it takes advantage of better anti-aliasing attenuation than a digital implementation and being more robust against interference in a system-on-chip (SoC) environment. On the other hand, the compensation circuit 154 is arranged on the digital stage 100B rather than the analog stage 100A. Therefore, the chip area can be reduced since the digital device uses a smaller area than the analog device. As a result, the modulation circuit 100 of the present invention exploits the benefits of both analog and digital circuits and also provides the advantages of a reduced circuit area, feedback latency and digital ELD compensation.

Figure 2:
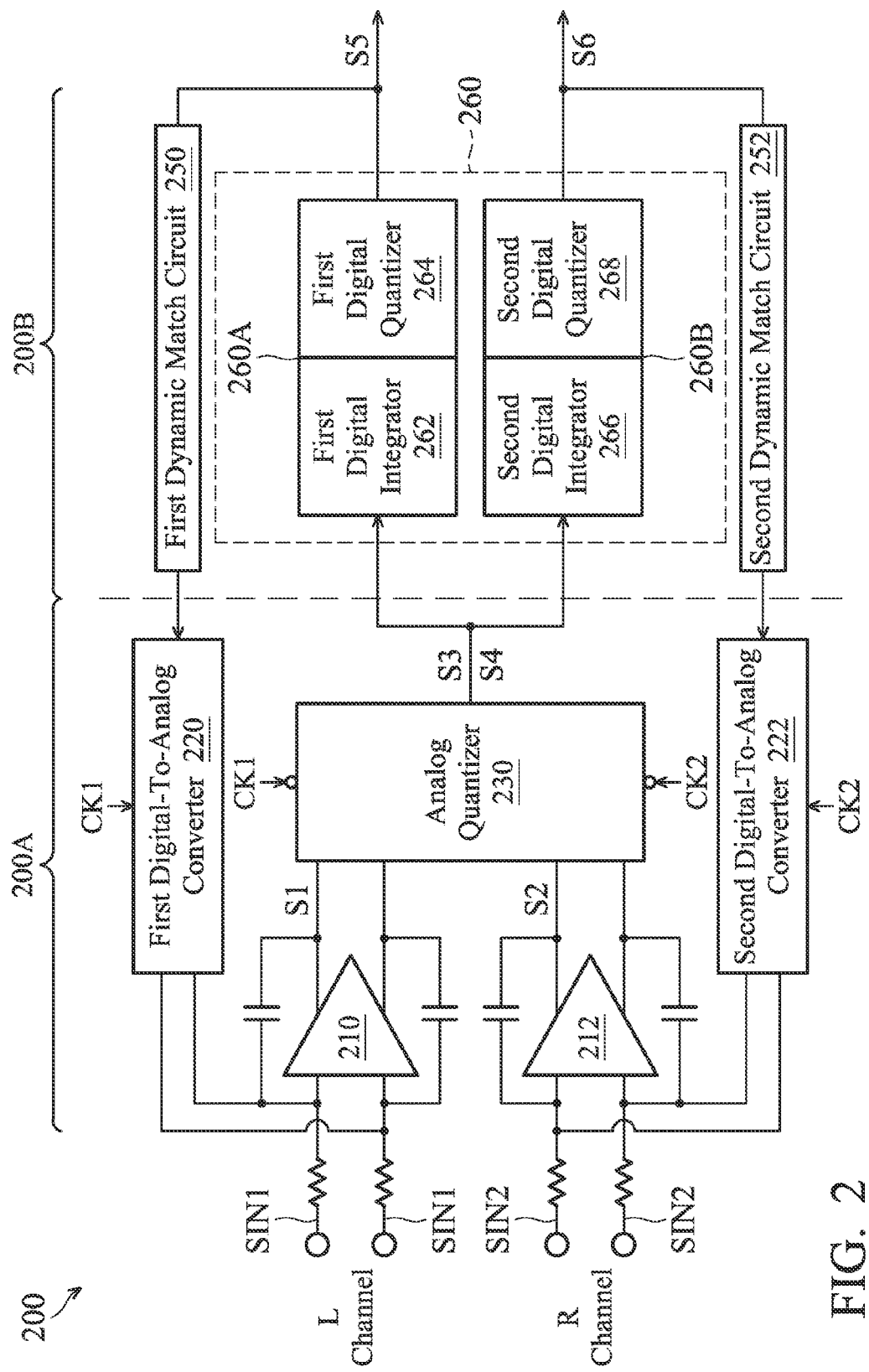
FIG. 2 is a schematic diagram of a modulation circuit for multiple channels according to the present invention.

FIG. 2 is a schematic diagram of a modulation circuit 200 for multiple channels according to the present invention. The modulation circuit 200 includes an analog stage 200A and a digital stage 200B. As shown in FIG. 2, the first analog integrator 210, the second analog integrator 212, the first digital-to-analog converter 220, the second digital-to-analog converter 222 and the analog quantizer 230 are arranged on the analog stage 200A. The first dynamic match circuit 250, the second dynamic match circuit 252 and the processing unit 260 are arranged on the digital stage 200B. The modulation circuit 200 is utilized to modulate a plurality of audio signals of two channels. For example, the first analog integrator 210 receives and integrates the signal SIN1 from the left channel to integrate and output the signal S1 (the first input signal). The second analog integrator 212 receives and integrates the signal SIN2 from the right channel to integrate and output the signal S2 (the second input signal).

Afterwards, the analog quantizer 230 receives and quantizes the signal S1 for generating a signal S3 (the first digital input signal), and it also receives and quantizes the signal S2 for generating a signal S4 (the second digital input signal). In addition, the processing circuit 260 is arranged on the digital stage 200B and coupled to the analog quantizer 230 for compensating a time delay of the modulation circuit 200. For example, the analog quantizer 230 is an ASAR. Instead of utilizing two analog quantizers for implementing the two channels, the shared analog quantizer 230 could provide better integration and better power efficiency. In addition, the analog quantizer 230 is triggered by the first clock signal CK1 and the second clock signal CK2 which is different from the first clock signal CK1. In one embodiment, the analog quantizer 230 computes or quantizes the signal S1 with the first clock signal CK1, and it computes or quantizes the signal S2 with the second clock signal CK2. In another embodiment, the analog quantizer 230 is triggered by only one clock signal, and it quantizes the signal S1 with the rising edge of the clock signal and quantizes the signal S2 with the falling edge of the clock signal. For example, the analog quantizer 230 is a 6-bit ASAR operated at 24 MHz sampling rate to accomplish a complete conversion including sampling and computing in a clock cycle. For another example, the analog quantizer 230 is operated at a double sampling rate of 48 MHz to convert and quantize the signals S1 and S2 in a sequential manner. Specifically, the analog quantizer 230 is switched to the right channel after it completes the conversion for the left channel, and vice versa.

In one embodiment, the processing circuit 260 is utilized to truncate the signal S3 to generate a signal S5 (the first truncation signal) after the time delay is compensated, and truncate the signal S4 to generate a signal S6 (the second truncation signal) after the time delay has been compensated. Specifically, the processing circuit 260 includes a first digital processing unit 260A and a second digital processing unit 260B. The first digital processing unit 260A includes the first digital integrator 262 for filtering and the first digital quantizer 264 for the truncation. The second digital processing unit 260B includes the second digital integrator 266 for filtering and the second digital quantizer 268 for the truncation. As shown in FIG. 2, the first digital processing unit 260A operates the signal S3 and outputs the signal S5. The second digital processing unit 260B operates the signal S4 and outputs the signal S6. It should be noted that the ELD compensation could be executed by the first digital processing unit 260A and the second digital processing unit 260B. More specifically, the ELD compensation is executed on the digital stage 200B before being truncated by the first digital quantizer 264 and the second digital quantizer 268 in order to provide a better compensation with unrestricted gains.

In addition, the modulation circuit 200 includes a first digital-to-analog circuit converter 220 and a second digital-to-analog converter 222 which are arranged on the analog stage 200A. The first digital-to-analog converter 220 is coupled to the analog quantizer 230 and input by the first clock signal CK1 to convert the signal S5. The second digital-to-analog converter 222 is coupled to the analog quantizer 230 and input by the second clock signal CK2 to convert the signal S6. In one embodiment, the modulation circuit 200 further includes a first dynamic match circuit 250 and a second dynamic match circuit 252 which are arranged on the digital stage 200B. Specifically, the first dynamic match circuit 250 is coupled between the first digital-to-analog converter 220 and the first digital processing circuit 260A to improve linearity of the signal S5. The second dynamic match circuit 252 is coupled between the second digital-to-analog circuit 222 and the second digital processing circuit 260B to improve linearity of the signal S6.

Figure 3:
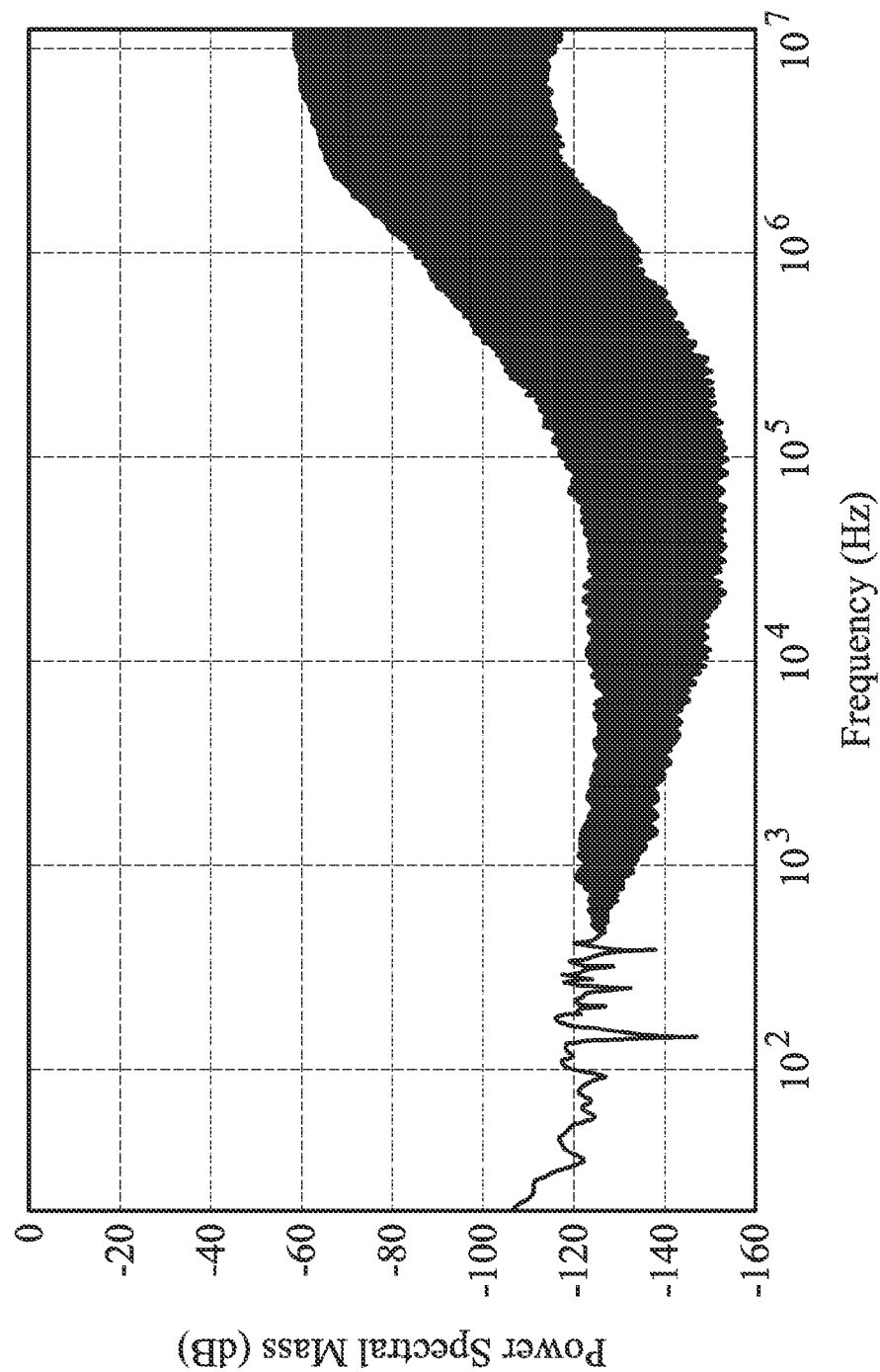
FIG. 3 is a spectrum illustrating the performance of a modulation circuit according to the present invention.

FIG. 3 is a spectrum illustrating the performance of a modulation circuit according to the present invention. As shown in FIG. 3, because the modulation circuits 100 and 200 have the ELD compensation to compensate for the time delay with any value of gain, the spectrum of FIG. 3 displays a smooth curve without peaking especially in the frequency range between 1 MHz to 10 MHz. Therefore, the stability and the reliability can also be improved by utilizing the modulation circuit of the present invention.

Figure 4:
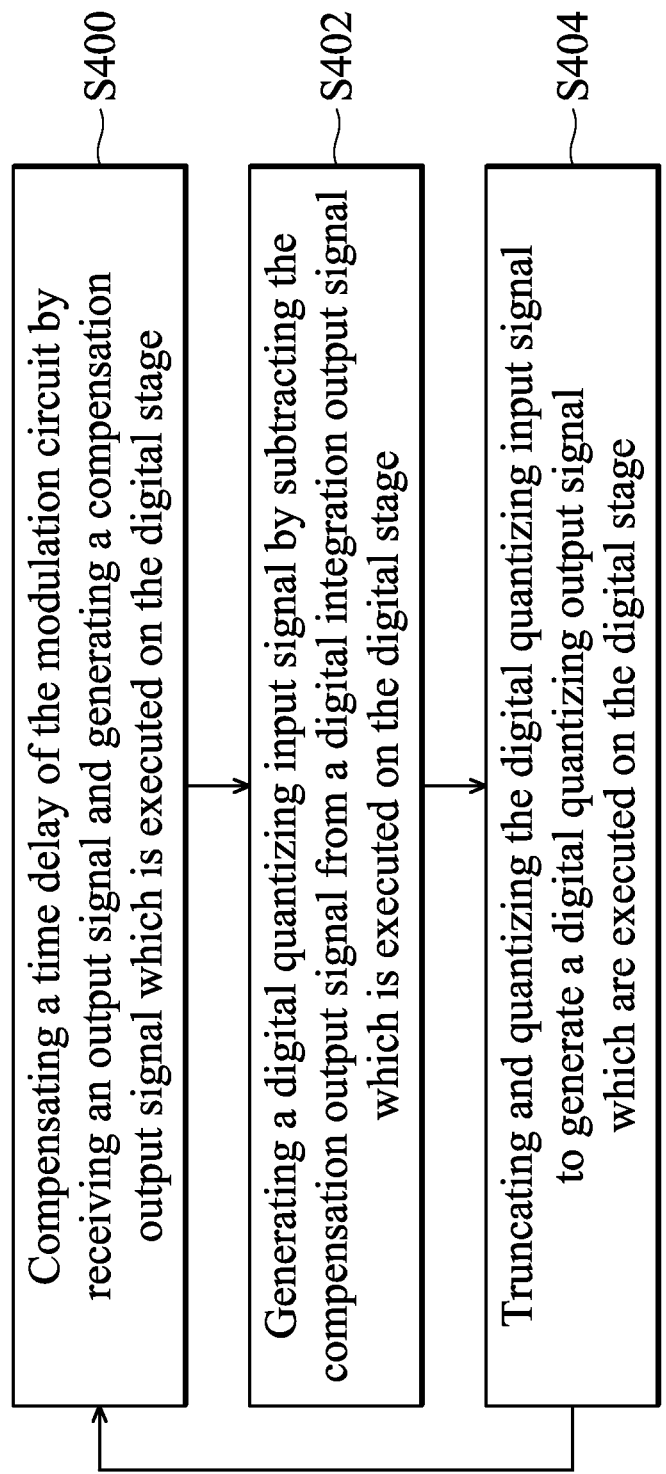
FIG. 4 is a schematic diagram illustrating a modulation method according to the present invention.

FIG. 4 is a schematic diagram illustrating a modulation method according to the present invention. The modulation method is applied to a modulation circuit which includes an analog stage and a digital stage. As shown in FIG. 4, in step S400, a time delay of the modulation circuit is compensate for by receiving an output signal and generating a compensation output signal which are executed on the digital stage. Afterwards, in step S402, a digital quantizing input signal is generated by subtracting the compensation output signal from a digital integration output signal which is executed on the digital stage. In addition, in step S404, the digital quantizing input signal is truncated and quantized to generate a digital quantizing output signal which is executed on the digital stage. Afterwards, the step S400 is executed again to compensate for the time delay.

In one embodiment, the modulation method further includes converting the output signal to generate an analog output signal which is executed on the analog stage, subtracting the analog output signal from an input signal to generate an analog input signal which is executed on the analog stage, and integrating the analog input signal to generate an analog quantizing input signal which is executed on the analog stage. In another embodiment, the modulation method further includes converting the analog quantizing input signal into a digital conversion signal which is executed on the analog stage, and receiving and integrating the digital input signal to generate the digital integration output signal which are executed on the digital stage.

The modulation circuit provided by the present invention is featured by an analog first stage and a digital second stage including a digital ELD compensation. The analog stage rejects the noise aliased by the sampling analog quantizer, and the following digital stage has the advantage of small size. In addition, the ELD is compensated for on the digital stage before the signal truncation to provide a better compensation with unrestricted gains. Accordingly, the feedback latency is allowed in the proposed modulation circuit. Moreover, the analog quantizer could be shared for dual-channel operations. This proposed hybrid modulation circuit enables the circuit area to be scaled down with advanced CMOS process technology.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A modulation circuit, comprising:
an analog stage, comprising:
an analog quantizer, utilized to sample and quantize an analog signal for generating a digital input signal; and
a digital stage, comprising:
a digital quantizer, utilized to receive and truncate a digital quantizing input signal according to the digital input signal for generating a digital quantizing output signal; and
a compensation circuit, coupled to the digital quantizer, utilized to compensate for a time delay of the modulation circuit and generate a compensation output signal, wherein the digital quantizing input signal is generated by subtracting the compensation output signal from a digital integration output signal to compensate for the time delay, the time delay comprising a time that the analog quantizer samples and quantizes the analog signal and a time that the digital quantizing output signal is fed back to the analog stage, wherein the compensation circuit comprises a flip flop and a digital multiplier.

2. The modulation circuit as claimed in claim 1, wherein the modulation circuit further comprises a digital integrator to receive the digital input signal and generate the digital integration output signal.

3. The modulation circuit as claimed in claim 2, wherein the modulation circuit further comprises a first adder coupled between the digital integrator and the digital quantizer, utilized to subtract the compensation output signal from the digital integration output signal for outputting the digital quantizing input signal.

4. The modulation circuit as claimed in claim 1, wherein the modulation circuit further comprises a digital-to-analog converter to convert the output signal and generate an analog output signal, and the compensation circuit is arranged between the digital quantizer and the digital-to-analog converter.

5. The modulation circuit as claimed in claim 4, wherein the modulation circuit further comprises a third adder to subtract the analog output signal from an input signal for generating an analog input signal.

6. The modulation circuit as claimed in claim 5, wherein the modulation circuit further comprises an analog integrator coupled to the third adder to receive and integrate the analog input signal for generating an analog quantizing input signal.

7. The modulation circuit as claimed in claim 6, wherein the analog quantizer is coupled to the analog integrator for converting the analog quantizing input signal into a digital conversion signal.

8. The modulation circuit as claimed in claim 7, wherein the compensation circuit, the digital-to-analog converter and the analog quantizer are triggered by a clock signal.

9. A modulation circuit, comprising:
a shared analog quantizer configured for dual-channel operations, the shared analog quantizer receiving a first input signal for generating a first digital input signal and receiving a second input signal for generating a second digital input signal, wherein the first input signal and the second input signal are generated in different channels; and
a processing circuit, coupled to the analog quantizer for compensating a time delay of the modulation circuit, and truncating the first digital input signal to generate a first truncation signal after the time delay is compensated for, and truncating the second digital input signal to generate a second truncation signal after the time delay is compensated for, the truncation of the first and second digital inputs signals corresponding to reducing a respective bit width.

10. The modulation circuit as claimed in claim 9, wherein the processing circuit further comprises:
a first digital processing circuit, utilized for compensating the time delay and truncating the first digital input signal to generate a first truncation signal after the time delay is compensate for; and
a second digital processing circuit, utilized for compensating the time delay and truncating the second digital input signal to generate a second truncation signal after the time delay is compensate for.

11. The modulation circuit as claimed in claim 9, wherein the analog quantizer is input by a first clock signal and a second clock signal different from the first clock signal to alternatively quantize the first input signal and the second input signal.

12. The modulation circuit as claimed in claim 11, wherein the modulation circuit further comprises a first digital-to-analog converter and a second digital-to-analog converter, the first digital-to-analog circuit is coupled to the analog quantizer and input by the first clock signal to convert the first truncation signal, and the second digital-to-analog circuit is coupled to the analog quantizer and input by the second clock signal to convert the second truncation signal.

13. The modulation circuit as claimed in claim 12, the modulation circuit further comprises a first dynamic match circuit and a second dynamic match circuit, the first dynamic match circuit is coupled between the first digital-to-analog converter and the first digital processing circuit to improve linearity of the first truncation signal, and the second dynamic match circuit is coupled between the second digital-to-analog converter and the second digital processing circuit to improve linearity of the second truncation signal.

14. A modulation method utilized for a modulation circuit, comprising:
   compensating, by a compensation circuit, a time delay of the modulation circuit by receiving an output signal and generating a compensation output signal, the time delay corresponding to analog quantization time of an analog stage and feedback time of the output signal to the analog stage;
   generating a digital quantizing input signal by subtracting the compensation output signal from a digital integration output signal;
   truncating and quantizing the digital quantizing input signal to generate a digital quantizing output signal, wherein compensating the time delay is executed before truncating and quantizing the digital quantizing input signal; and
   adding a truncation noise to the digital quantizing output signal to generate the output signal input to the compensation circuit.

15. The modulation method as claimed in claim 14, further comprising:
   converting the output signal to generate an analog output signal.

16. The modulation method as claimed in claim 15, further comprising:
   subtracting the analog output signal from an input signal to generate an analog input signal; and
   integrating the analog input signal to generate an analog quantizing input signal.

17. The modulation method as claimed in claim 16, further comprising:
   converting the analog quantizing input signal into a digital conversion signal; and
   adding a quantization noise to the digital conversion signal to generate a digital input signal.

18. The modulation method as claimed in claim 17, further comprising receiving and integrating the digital input signal to generate the digital integration output signal.

* * * * *